United States Patent [19]

Kunze-Concewitz et al.

[11] Patent Number: 4,979,464
[45] Date of Patent: Dec. 25, 1990

[54] APPARATUS FOR TREATING WAFERS IN THE MANUFACTURE OF SEMICONDUCTOR ELEMENTS

[75] Inventors: Horst Kunze-Concewitz, Wiernsheim; Hans Muller-Uri, Muhlacker, both of Fed. Rep. of Germany

[73] Assignee: Convac GmbH, Wiernsheim, Fed. Rep. of Germany

[21] Appl. No.: 205,577

[22] Filed: Jun. 13, 1988

[30] Foreign Application Priority Data

Jun. 15, 1987 [DE] Fed. Rep. of Germany ....... 3719952

[51] Int. Cl.$^5$ .............................................. C23C 16/00
[52] U.S. Cl. .................................... 118/719; 118/724; 118/725; 118/727; 118/729; 165/80.4; 165/80.5; 219/390; 219/405; 414/331; 392/407
[58] Field of Search ............... 118/719, 724, 727, 729, 118/725; 414/331; 165/80.4, 80.5; 219/354, 388, 390, 405, 411

[56] References Cited

U.S. PATENT DOCUMENTS

| | | | |
|---|---|---|---|
| 4,362,454 | 12/1982 | Kripzak | 414/331 |
| 4,457,359 | 7/1984 | Holden | 165/80.5 |
| 4,457,662 | 7/1984 | Ireland et al. | 414/331 |
| 4,527,620 | 7/1985 | Pedersen et al. | 165/80.5 |
| 4,640,223 | 2/1987 | Dozier | 118/719 |

FOREIGN PATENT DOCUMENTS 7118 1/1987 Japan ................................... 118/729
85/05758 12/1985 PCT Int'l Appl. .

OTHER PUBLICATIONS

IBM Technical Disclosure Bulletin, vol. 25, No. 4, Sep. 1982.

Primary Examiner—Norman Morgenstern
Assistant Examiner—Terry J. Owens
Attorney, Agent, or Firm—Jones, Tullar & Cooper

[57] ABSTRACT

An apparatus for the treatment of wafers in the manufacture of semiconductor elements in the form of a process buffer through which a plurality of wafers travel at the same time to various treatment stations and which cooperates with a transport apparatus for the wafers. The apparatus has a shaft magazine, in which the treatment stations, each for one wafer, are disposed spaced apart from and above one another. The shaft magazine is provided with a loading and unloading opening, and the treatment stations are movable individually into the vicinity of the loading and unloading opening. The apparatus occupies less surface area in the process line for the manufacture of semiconductor elements, enables treatment of the wafers independent of external factors, and can be used for various types of treatment of the wafers in the manufacture of semiconductor elements.

29 Claims, 2 Drawing Sheets

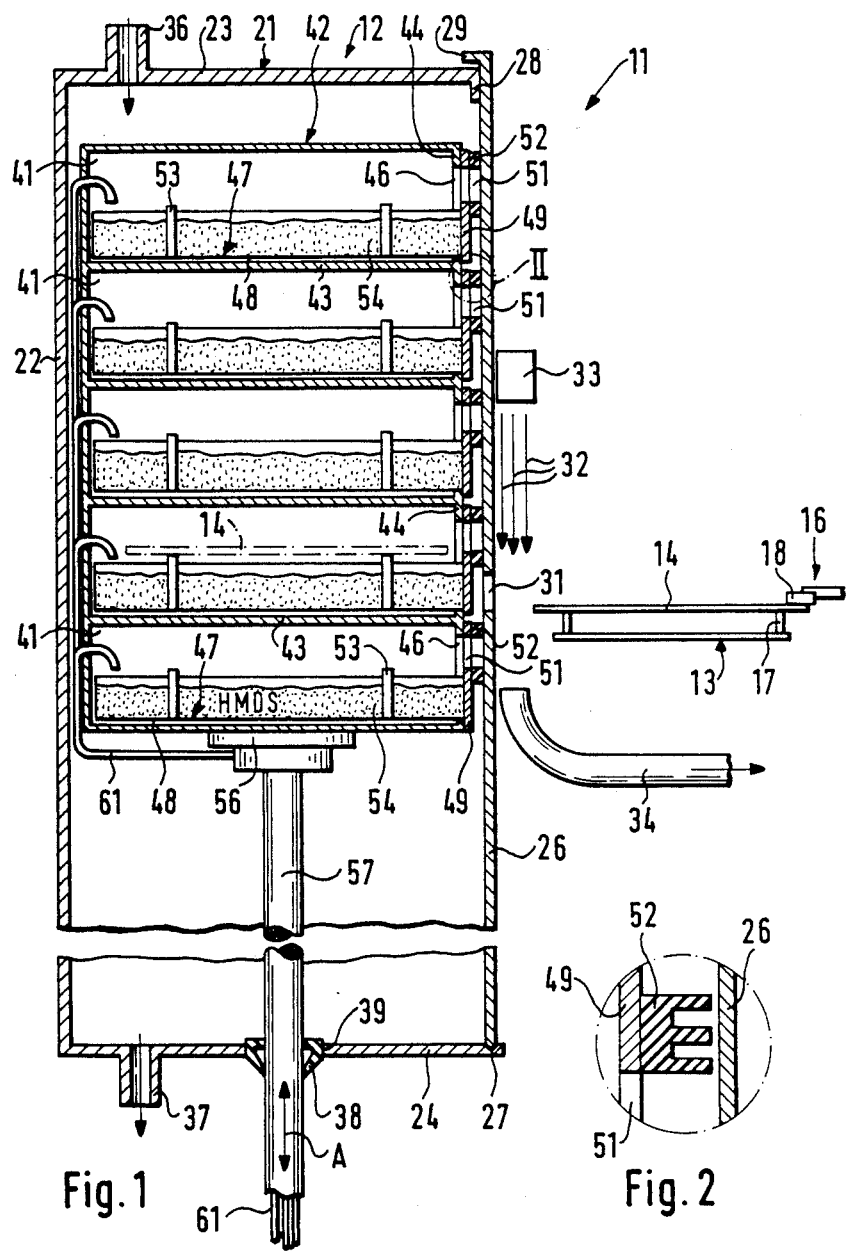

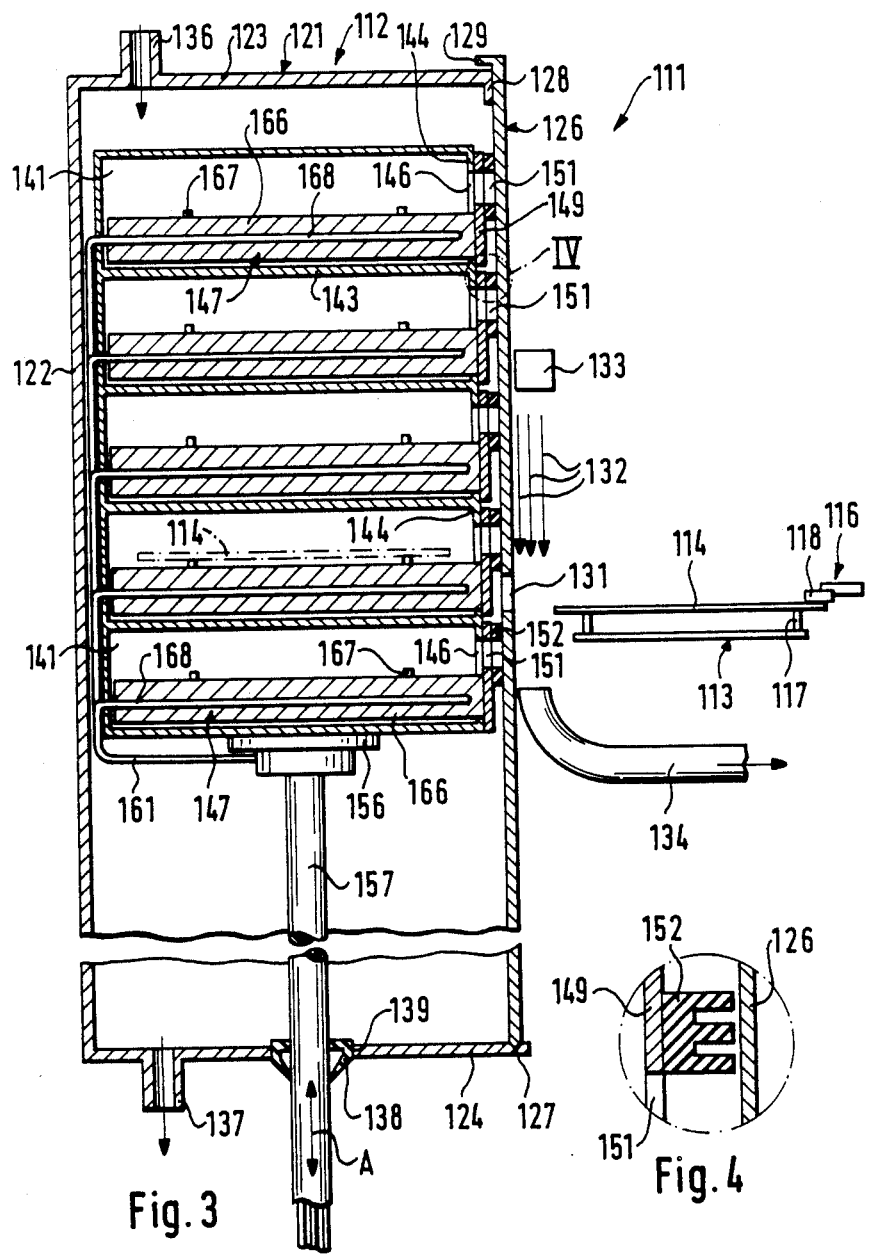

APPARATUS FOR TREATING WAFERS IN THE MANUFACTURE OF SEMICONDUCTOR ELEMENTS

FIELD OF THE INVENTION

The present invention relates to an apparatus for treating wafers under clean-room conditions in the manufacture of semiconductor elements. The apparatus, in the form of a process buffer, has a plurality of wafers traveling through it simultaneously at various treatment stations and cooperates with a transport apparatus for the wafers.

BACKGROUND OF THE INVENTION

Wafers, for instance silicon wafers, require a plurality of treatment processes, among them coating processes, for the manufacture of semiconductor elements. As a first step, the polished surface of the wafer must be provided with an adhesion promoter, by the process known as priming, so that a suitable structure can be applied subsequently in a photolithographic process. Furthermore, processes are needed in which the wafer is either cooled down or heated in accordance with a predetermined time curve. All of these processes are done substantially in a clean-room atmosphere and/or in a protective gas atmosphere.

In the aforementioned so-called priming, the wafer is placed, in a largely closed room, on a dish that is filled with an evaporating process medium, namely HMDS (hexamethylenedisilicane). Extreme clean-room conditions must prevail, because the wafer must not become contaminated by even the smallest foreign particle. The process time (priming time) is approximately 4 to 5 minutes, and thus is longer than most of the ensuing process times in the production line, which are on the order of magnitude of only one minute. The cycling time of the intermittently operating system is therefore designed for approximately one minute, and the priming takes place in a kind of buffer apparatus in which a plurality of wafers are located.

Known apparatuses for the priming of wafers are embodied in the form of a tunnel, which is provided with a plurality of treatment stations, for example 5 in number, along its length, or in other words for the treatment of 5 wafers as an example. The wafers are moved in increments through the tunnel, in which the process medium is disposed in an elongated dish, by means of a transport apparatus in such a manner that the aforementioned process time of the production line is attained. The tunnel has an inlet lock and an outlet lock, which can be opened and closed at the cycling rate of this tunnel.

Known apparatuses in which the wafers are cooled down or heated, which is for instance done in a protective gas atmosphere, each have only a single treatment station for a single wafer, so multiple apparatuses are therefore typically provided along the process line. Since once again the process time of this heat treatment apparatus is greater than the average cycling or process time of the production line, these heat treatment apparatuses are located next to the transport apparatus and are alternately loaded.

A disadvantage of the known tunnel-like priming apparatus is its great structural length, and furthermore the fact that the transport apparatus is guided through the processing station, which means that its mechanically movable parts cause abrasion and can contaminate the wafers. Furthermore, because of drafts, the tunnel-like arrangement does not permit uniform distribution of the fog of the evaporated process medium.

The known heat treatment apparatuses have the disadvantage that since they are each intended for only a single wafer, a plurality of them must be provided at a time, so that multiple handling devices for feeding the wafers into and out of the apparatuses must also be provided.

SUMMARY OF THE INVENTION

It is an object of the present invention to provide an apparatus for the treatment of wafers in the manufacture of semiconductor elements of the type described above, which occupies less surface area in the process line, enables treatment of the wafers independently of external factors, and can be used for various types of treatment of the wafers in the manufacture of semiconductor elements.

In accordance with the invention, such an apparatus is provided with a shaft magazine, in which the treatment stations, each for one wafer, are disposed spaced apart from and one above the other; the shaft magazine is provided with at least one loading and unloading opening, and the treatment stations are movable individually into the vicinity of the loading and unloading opening. Because of the vertical arrangement, the apparatus is limited to a minimum surface area, by comparison with the known tunnel-like apparatus. This is particularly favorable in view of the recently introduced increase in wafer size. If the apparatus is used for priming the wafers, it is completely separate from the wafer transport apparatus and is self-contained and thus protected against contaminants that could be brought in by the transport apparatus. Furthermore, the priming process is also unaffected by the loading and unloading processes, because the only treatment station that communicates with the outside atmosphere is the one just being loaded with a new wafer or from which a cultered wafer is being unloaded. The other treatment stations are unaffected by and shielded from this loading and unloading process.

Moreover, the apparatus according to the invention can advantageously be used not only for the priming processes but also for the heat-treatment processes, the cycling times of which can in this way also be adapted to the average cycling time of the production line. Once again, less surface area is needed, because the heat treatment stations, a plurality of which were previously individually present, can be stacked one above the other in one apparatus. This also provides for economical handling, because only a single handling device for loading and unloading needs to be provided per heat-treatment apparatus, with its plurality of treatment stations.

It is for instance possible to provide a single loading opening and a single unloading opening, located opposite it, on the shaft magazine; the two openings can be offset from one another in height, to avoid drafts. In accordance with a preferred exemplary embodiment of the present invention, however, only a single combined loading and unloading opening is provided in the shaft magazine. This has the advantage that the transport apparatus is not interrupted by the treatment apparatus but instead can be moved past it, which has advantages in terms of the cycling time to be adhered to. Furthermore, instead of needing two handling devices, only a single handling device for both loading and unloading is needed.

For reliably preventing the treatment stations from being affected during the priming process, or in other words in their positions of repose in which loading or unloading is not being done, it is provided in an exemplary embodiment that each treatment station be sealed off, in these positions of repose, from the loading and unloading opening. The sealing is suitably accomplished in that each treatment station is embodied by a closed receiving chamber, which is provided on one side with a single loading and unloading window, preferably surrounded by a contactfree labyrinth sealing strip. As a result, in every case, major crosswise flows inside a treatment station and inside the entire shaft magazine are avoided, and on the other hand soiling is prevented, because no abrasion-produced particles can occur.

In accordance with another embodiment of the present invention, it is advantageously attained that the gas curtain of a laminar flow, for instance of nitrogen or scrubbed air, prevents the external atmosphere from getting into the treatment station during loading and unloading, and has the effect that any evaporated process medium that might escape during the loading and unloading is carried away in the priming process.

For instance, it is possible for the magazine case to be composed of individually stackable containers. However, in a further exemplary embodiment, the treatment stations are embodied in the form of drawers, which are movable up and down with a onepiece magazine case. This enables easy removal and cleaning of the treatment stations, especially if in accordance with another feature of the invention, the front panel of the magazine housing is retained in a removable manner.

The drawers or the magazine case receiving them are made movable up and down by means of a slide rod, which can be actuated pneumatically, hydraulically, electrically, or in some other manner.

The shaft magazine is provided at two opposed ends of its housing, in another feature of the invention, with an inlet and an outlet opening, to enable flooding of the interior of the shaft magazine. This is useful for instance before the beginning of a treatment process, for example in order to clean the interior with clean air. However, it is also suitable to flood the interior with nitrogen, for example, if a heat treatment is to be performed with the apparatus, so as to prevent oxidation. It is also possible with this feature to provide a slight overpressure in the atmosphere inside the shaft magazine, which prevents the outside atmosphere from getting into the shaft interior.

As already mentioned, the apparatus according to the invention is suitably used either for priming processes, or for heat-treatment processes (including cooling). In the first case, for the sake of automatic processing, it is particularly important in accordance with a further feature of the invention for a supply line to lead to each treatment station, for supplying the priming medium automatically. With this automatic process medium refilling apparatus, the system operates substantially without maintenance, which has substantial advantages as compared with previous equipment which had to be refilled by hand. For example, the apparatus need no longer be opened, which would interrupt the process. This provision also substantially reduces, if not entirely precludes, the danger of soiling.

In other cases, in which the apparatus according to the invention is used for heat-treatment processes, the treatment stations are supplied with the heating or cooling medium, or with electrical energy in the case of heating.

All of these supply lines, in accordance with a further exemplary embodiment of the present invention, are suitably extended from the outside through the slide rod, on which the magazine case having the drawers or stackable containers for the treatment stations is mounted.

Further details of the invention will become apparent from the ensuing description, in which exemplary embodiments are described in detail in conjunction with the drawings.

BRIEF DESCRIPTION OF THE DRAWINGS

FIG. 1 is a schematic, longitudinal section, partly truncated, of an apparatus for priming wafers in accordance with an exemplary embodiment of the present invention;

FIG. 2, on a larger scale, shows a detail demarcated by the circle II in FIG. 1;

FIG. 3 is a schematic, longitudinal section, partly truncated, of an apparatus for the heat treatment of wafers in accordance with another exemplary embodiment of the present invention; and FIG. 4, on a larger scale, shows a detail demarcated by the circle IV in FIG. 3.

DESCRIPTION OF THE PREFERRED EMBODIMENTS

The apparatus 11 or 111 shown in the drawing is used for priming wafers under clean-room conditions or for heat-treating wafers (heating and/or cooling), preferably in a protective gas atmosphere, in each case in the manufacture of semiconductor elements. Both apparatuses are disposed in a production line, or are part of such a production line, in the manufacture of semiconductor elements for instance from silicon wafers, and are embodied such that the cycling time of each such treatment, or treatment process, is adapted to the typically shorter average cycling time of the entire production line.

The apparatus 11 has a shaft&: magazine 12, before which, on one side, are a transport apparatus 13 for the wafers 14 and a handling device 16 for loading and unloading the wafers, 14 into and out of the shaft magazine 12 and from and to the transport apparatus 13.

The transport apparatus 13 may be of any arbitrary kind; a plurality of supports 17, for example four in number, form one transport station for one wafer 14. The handling device 16 has a gripper, shown only schematically, preferably in the form of a vacuum gripper 18.

The shaft magazine 12, which in the illustrated exemplary embodiment is of rectangular cross section, but depending on the outline of the wafer 14 may have some other cross-sectional form instead, has an upwardly elongated shaft housing 21, which has side walls (not shown), a back wall 22, which is firmly joined to a cap 23 and bottom 24, and a removable front wall 26. At its lower end, the front wall 26 is placed in or inserted into a notch or groove 27 in the bottom 24 and optionally at the side walls as well, and at its upper end it is releasably screwed tightly to a bent-over edge 28 of the cap 23. An angular end 29 of the front wall 26 protruding beyond the cap 26 is embodied as a handle for the removal and insertion of the front wall. In a region approximately midway up its height, the front wall 26 has a slit-like loading and unloading opening 31 extending over substantially its entire width, the width of the opening being dependent on the width of the wafers 14 to be handled and the height of the opening depending on the corresponding dimensions of the gripper 18 that handles the wafers. The bearing surface of the supports 17 of the transport apparatus 13 for the wafers 14 is located substantially at the height of the loading and unloading opening 31.

A gas curtain, in the form of a laminar flow 32 sweeping past the opening 31, is provided in front of the single combined loading and unloading opening 31 of the shaft housing 21 of the shaft magazine 12. The blower outlet 33 of the gas curtain is located above the loading and unloading opening 31, and the suction intake of the gas curtain, here in the form of a pipe run 34 and/or a conduit, is located below the loading and unloading opening 31. This protective-gas curtain 32 is for instance embodied by a clean-air or nitrogen flow, which sweeps directly past the loading and unloading opening 31.

On its cap 23, the shaft housing 21 has an inlet pipe 36, and on its bottom 24 it has an outlet pipe 37, through which pipes the interior of the entire shaft magazine 12 can be flooded, so that cleaning by means of clean air can be done prior to the beginning of the treatment process, or during a treatment process a nitrogen atmosphere or similar protective-gas atmosphere can be developed that is at atmospheric pressure or at a slight overpressure. This also makes air conditioning of the shaft magazine interior possible.

Inside the shaft housing 21 of the shaft magazine 12, a magazine case 42 is provided subdivided into a plurality of compartments 41. The magazine case 42 may for instance be assembled from stackable containers forming the compartments 41. In the exemplary embodiment shown, however, the magazine case 42 is in one piece and for forming the compartments 41 is provided with a plurality of partitions 43, and is closed except for its front panel 44, which faces the front wall 46 of the shaft housing 21. The front panel 44 of each compartment 41 of the magazine case 42 has an opening 46 extending over substantially the entire width, but the height of the opening is less than the inside height of each compartment 41. A drawer 47 can be inserted or introduced into the opening 46 of each compartment 41 of the magazine case 42, each drawer serving as a treatment station for one wafer 14. The drawer 47 has a tub 48 and a front panel 49 protruding upward beyond the tub, which when the drawer 47 is pushed in closes the opening 46. The front panel 49, for its part, however, has a loading and unloading window 51, the size of which is equivalent to the loading and unloading opening 31 and which serves to allow the introduction or removal of the applicable wafer 14 whenever a loading and unloading window 51 of one of the drawers 47 is in alignment with the loading and unloading opening 31 of the shaft housing 21. On its outside, each front panel 49 is equipped with a labyrinth sealing strip 52, which surrounds the loading and unloading window 51. From FIG. 2 it can be seen that the sealing strip 52 is not in contact with the inside of the front wall 26 of the shaft housing 21, so that no abrasion is possible.

Support bolts 53 are provided inside each tub 48 of the drawer 47, which protrude beyond the height of the tub and upon which the applicable wafer 14 can be placed. In this exemplary embodiment, a bath of a process medium 54, such as HMDS (hexamethylenedisilicane) is provided in the tub, which evaporates during the treatment and settles in the form of a fog on the wafer 14 to be treated.

The magazine case 42, with its priming stations or drawers 47, is secured to a base 56, the lower end of which is connected to a slide rod 57. This hollow slide rod 57 is movably guided through an opening 39, provided with a seal 38, in the bottom 24 of the shaft housing 21 and is provided in a manner not shown with a pneumatic, hydraulic or electric drive, which is capable of moving the slide rod 57 upward and downward as indicated by the double arrow A.

Supply lines 61, namely lines for delivering the process medium HMDS from the outside to inside the shaft magazine 12, are extended through the hollow slide rod 57. These supply lines 61 emerge laterally in the base 56 and are extended through the rear wall of the magazine case 42, each individually to the applicable drawer 47. Through this supply line 61, the tubs 48 of the drawers 47 are automatically refilled with the process medium. In a manner not shown, pumps are provided for this purpose in the supply lines 61, and the pumps are capable of reacting for instance to fill-level meters in the drawers or the like, or can dispense process medium as a function of time.

The function of this apparatus, which in this exemplary embodiment shown is intended for priming or coating the wafers 14 with the aid of the process medium HMDS, is as follows: Before operation begins, the interior of the shaft magazine 12 is for instance cleaned with the aid of clean air introduced through the inlet pipe 36. Once the protective-gas curtain 32 is turned on, the lowermost drawer 47, for instance, is raised with the aid of the slide rod 57 in such a manner that its loading and unloading window 51 is in alignment with the loading and unloading opening 31 in the shaft housing 21. With the aid of the gripper 18, a wafer 14 to be handled can then be placed in this treatment station 47. Immediately after that, by lowering of the magazine case 42, the drawer 47 above is brought into alignment with its loading and unloading window 51 with the loading and unloading opening 31 in the shaft housing 21, so that this drawer 47 can be loaded. This also means that the drawer just previously loaded is now in a space that is sealed off from the external atmosphere. By lowering of the magazine case 42, all the drawers 47 are thus loaded in succession with a wafer 14 to be handled. Once the final drawer 47 has been loaded, the priming time for the wafer 14 disposed in the lowermost drawer 47 has elapsed, so that this treated wafer 14 can now be unloaded. This is done by raising the magazine case 42 all the way to the top again, so that the loading and unloading window of the lowermost drawer 47 is in alignment with the loading and unloading opening 31 in the shaft housing 21. With the aid of the gripper 18, the primed wafer 14 is removed or unloaded from the drawer 47. By cycling of the transport apparatus 13 further, however, a new wafer 14 to be treated is now immediately subsequently loaded into this lowermost drawer 47 of the magazine case 42. This process then takes place for the drawer 47 located above it, and so forth, so that the drawers 47 are unloaded and re-loaded in succession. Once this has been done for the uppermost drawer 47, the process begins from the beginning again with the lowermost drawer 47. During this loading and unloading, the drawers 47 that are not in the loading and unloading position, but instead are in their priming position or position of repose, do not communicate with the external atmosphere, because of the disposition of the labyrinth-like sealing strip shown in detail in FIG. 2, which prevents crosswise flows from the outside into the inside of the drawers. The protective-gas curtain 32 furthermore prevents the entry of contaminant particles from: the external atmosphere into the particular drawer 47 as it is being loaded or unloaded.

In the exemplary embodiment, five such drawers 47 and hence five treatment or priming stations for the wafers 14 are provided. It will be understood that this number can be greater or less. In the example shown, the number is the result of the fact that the priming of a wafer 14 takes approximately 5 times as long as the average process time in the production line, so that the relatively long priming time for one wafer 14 can be adapted to the average processing or cycling time that is attained in the transport apparatus 13.

The apparatus 111 shown in FIGS. 3 and 4 is modified by comparison with the apparatus 11 of FIGS. 1 and 2 in that it is suitable for a heat treatment of the wafers 14. For instance, following a coating or laquering process, the wafers must be heated in accordance with a predetermined temperature ramp or time curve to a predetermined temperature, or after a heating process they must be cooled down again to normal temperature, again in accordance with a predetermined temperature ramp or time curve. These heat-treatment processes also last longer, for each individual wafer 14, than the average cycling time of the production line, so that in this apparatus 111 as well, a predetermined number of heat-treatment stations 147 (drawers) is provided.

Since the apparatus 111 substantially corresponds to the apparatus 11, only the differences between them will be addressed below, while all the other identical components are identified by the same reference numeral raised by 100, and are not described again in detail. Briefly, however, the apparatus 111 for the heat treatment of wafers 114 has a shaft magazine 112, before which are a transport apparatus 113, identical to the apparatus 13, and a handling device 116, identical to the device 16. A shaft housing 121 is identical to &he shaft housing 21, and the protective-gas curtain 132 and the magazine case 142, which is movable up and down in the same manner with the aid of a slide rod 157, are again identical to those of the first exemplary embodiment.

An exception is the drawers 147, each of which is provided with a hot plate and/or cooling plate 166, to which the front panel 149 is secured and which is provided with suitable bearing pins 167 for the wafer 114. Each hot plate or cooling plate 166 has conduits 168, which communicate via supply lines 161 for the delivery of a heating and/or cooling medium. Once again, the supply lines 161 are extended to the outside via the interior of the slide rods 157. It will be understood that whenever the plate 166 is purely a hot plate, it can also be electrically heated, so that suitable electrical supply lines are provided.

The function of this apparatus 111 is equivalent to the above-described function of the apparatus 11. In a heat treatment of this kind, it is for instance possible to flood the shaft magazine 112 with a nitrogen atmosphere, to prevent oxidation upon heating of the wafers.

What is claimed is:

1. An apparatus for treating wafers, preferably under clean-room conditions, in the manufacture of semiconductor elements, comprising:
shaft magazine means having a plurality of treatment stations, each for one wafer, disposed spaced apart from and one above another, and at least one loading and unloading opening;
means for moving the treatment stations individually into the vicinity of the loading and unloading openings; and
transport means for transporting the wafers, individually, to and from the loading and unloading openings, whereby wafers are loaded and unloaded at the loading and unloading openings during treatment of the wafers in the treatment stations not in the vicinity of the loading and unloading openings.

2. The apparatus as defined in claim 1, wherein a single opening is provided for loading and unloading wafers.

3. The apparatus as defined in claim 1, wherein:
a single opening is provided for loading and unloading wafers; and
said transport means includes an associated gripper device for the loading and unloading of one wafer at a time, said gripper device being disposed in front of said single opening.

4. The apparatus as defined in claim 1, wherein:
said shaft magazine means includes a magazine housing and a magazine case within the magazine housing subdivided in accordance with the number of treatment stations, each treatment station being embodied as a drawer disposed in a given location in the subdivided magazine case; and
said transport means moves the magazine case up and down inside the magazine housing.

5. The apparatus as defined in claim 4, wherein the magazine housing includes a removable front panel disposed in front of the drawers.

6. The apparatus as defined in claim 4, wherein said transport means includes a slide rod connected to said magazine case.

7. The apparatus as defined in claim 1, wherein said shaft magazine means includes inlet and outlet means for the passage of a gas.

8. The apparatus as defined in claim 7, wherein the gas is clean-air.

9. The apparatus as defined in claim 7, wherein the gas is a nitrogen atmosphere.

10. The apparatus as defined in claim 7, wherein:
said shaft magazine means includes a cap side and bottom side; and
said inlet means is located in said cap side and said outlet means is located in said bottom side.

11. An apparatus for treating wafers, preferably under clean-room conditions, in the manufacture of semi-conductor elements, comprising:
shaft magazine means having a plurality of treatment stations, each for one wafer, disposed spaced apart from and one above another, and a single loading and unloading opening;
means for moving the treatment stations individually into the vicinity of the loading and unloading opening;
transport means for transporting the wafers to and from the loading and unloading opening; and
means for sealing off those treatment stations not being loaded or unloaded at said single opening.

12. An apparatus for treating wafers, preferably under clean-room conditions, in the manufacture of semi-conductor elements, comprising:

shaft magazine means having a plurality of treatment stations, each for one wafer, disposed spaced apart from and one above another, and at least one loading and unloading opening, each treatment station comprising a closed receiving chamber having a single loading and unloading window on one side thereof;

means for moving the treatment stations individually into the vicinity of the loading and unloading openings; and transport means for transporting the wafers to and from the loading and unloading openings.

13. The apparatus as defined in claim 12, further comprising:

a contact-free labyrinth sealing strip, surrounding the loading and unloading window of each closed receiving chamber.

14. An apparatus for treating wafers, preferably under clean-room conditions, in the manufacture of semi-conductor elements, comprising:

shaft magazine means having a plurality of treatment stations, each for one wafer, disposed spaced apart from and one above another, and at least one loading and unloading opening;

means for moving the treatment stations individually into the vicinity of the loading and unloading openings;

transport means for transporting the wafers to and from the loading and unloading openings; and means for providing a gas curtain having a laminar flow in front of each loading and unloading opening.

15. An apparatus for treating wafers, preferably under clean-room conditions, in the manufacture of semi-conductor elements, comprising:

shaft magazine means having a plurality of treatment stations, each for one wafer, disposed spaced apart from and one above another, and at least one loading and unloading opening, each treatment station including bearing means for supporting a wafer and a process medium to be evaporated for culturing the wafers;

means for moving the treatment stations individually into the vicinity of the loading and unloading openings; and transport means for transporting the wafers to and from the loading and unloading openings.

16. The apparatus as defined in claim 15, wherein said process medium preferably comprises HMDS.

17. The apparatus as defined in claim 15, further comprising:

means for delivering said process medium automatically to each treatment station.

18. The apparatus as defined in claim 17, wherein:

said shaft magazine means includes a magazine housing and a magazine case within the magazine housing subdivided in accordance with the number of treatment stations, each treatment station being embodied as a drawer disposed in a given location in the subdivided magazine case;

said transport means includes a slide rod connected to said magazine case for moving the magazine case up and down inside the magazine housing; and said means for delivering said process medium automatically to each treatment station extends through said slide rod.

19. An apparatus for treating wafers, preferably under clean-room conditions, in the manufacture of semi-conductor elements, comprising:

shaft magazine means having a plurality of treatment stations, each for one wafer, disposed spaced apart from and one above another, and at least one loading and unloading opening, each treatment station including bearing means for supporting a wafer, and heating plates;

means for moving the treatment stations individually into the vicinity of the loading and unloading openings; and transport means for transporting the wafers to and from the loading and unloading openings.

20. The apparatus as defined in claim 19, further comprising:

one supply line provided for delivering a heating medium to the heating plates of each treatment station.

21. The apparatus as defined in claim 20, wherein the supply line is an electrical line.

22. The apparatus as defined in claim 20, wherein:

said shaft magazine includes a magazine housing and a magazine case within the magazine housing subdivided in accordance with the number of treatment stations, each treatment station being embodied as a drawer disposed in a given location in the subdivided magazine case;

said transport means includes a slide rod connected to said magazine case for moving the magazine case up and down inside the magazine housing; and said supply line extends through said slide rod.

23. An apparatus for treating wafers, preferably under clean-room conditions, in the manufacture of semi-conductor elements, comprising:

shaft magazine means having a plurality of treatment stations, each for one wafer, disposed spaced apart from and one above another, and at least one loading and unloading opening, said treatment stations each including bearing means for supporting a wafer, and cooling plates;

means for moving the treatment stations individually into the vicinity of the loading and unloading openings; and transport means for transporting the wafers to and from the loading and unloading openings.

24. The apparatus as defined in claim 23, further comprising:

one supply line provided for delivering a cooling medium to the cooling plates of each treatment station.

25. The apparatus as defined in claim 23, further comprising:

an electrical supply line for supplying each treating station.

26. The apparatus as defined in claim 22, wherein:

said shaft magazine includes a magazine housing and a magazine case within the magazine housing subdivided in accordance with the number of treatment stations, each treatment station being embodied as a drawer disposed in a given location in the subdivided magazine case;

said transport means includes a slide rod connected to said magazine case for moving the magazine case up and down inside the magazine housing; and said supply line extends through said slide rod.

27. An apparatus for treating wafers, preferably under clean-room conditions, in the manufacture of semi-conductor elements, comprising:
   shaft magazine means having a plurality of treatment stations, each for one wafer, disposed spaced apart from and one above another, and a single loading and unloading opening;
   means for moving the treatment stations individually into the vicinity of the loading and unloading opening; and
   transport means for transporting the wafers to and from the loading and unloading opening, wherein:
   said shaft magazine means includes a magazine housing and a magazine case within the magazine housing subdivided in accordance with the number of treatment stations, each treatment station being embodied as a drawer disposed in a given location in the subdivided magazine case;
   said magazine housing includes a removable front panel disposed in front of the drawers; and
   said transport means moves the magazine case up and down inside the magazine housing.

28. An apparatus for treating wafers, preferably under clean-room conditions, in the manufacture of semiconductor elements, comprising:
   shaft magazine means having a plurality of treatment stations, each for one wafer, disposed spaced apart from and one above another, and at least one loading and unloading opening;
   means for moving the treatment stations individually into the vicinity of the loading and unloading openings; and
   transport means for transporting the wafers to and from the loading and unloading openings, wherein:
   said shaft magazine means includes a magazine housing and a magazine case within the magazine housing subdivided in accordance with the number of treatment stations, each treatment station being embodied as a drawer disposed in a given location in the subdivided magazine case; and
   said transport means includes a slide-rod connected to said magazine case for moving the magazine case up and down inside the magazine housing.

29. An apparatus for treating wafers, preferably under clean-room conditions, in the manufacture of semi-conductor elements, comprising:
   shaft magazine means having a plurality of treatment stations, each for one wafer, disposed spaced apart from and one above another, and a plurality of loading and unloading openings;
   transport means for transporting the wafers to and from the loading and unloading openings; and
   means for sealing off those treatment stations not being loaded or unloaded.

* * * * *